United States Patent [19]

Chan

[11] Patent Number: 4,569,122

[45] Date of Patent: Feb. 11, 1986

[54] METHOD OF FORMING A LOW RESISTANCE QUASI-BURIED CONTACT

[75] Inventor: Hugo W. K. Chan, Fremont, Calif.

[73] Assignee: Advanced Micro Devices, Inc., Sunnyvale, Calif.

[21] Appl. No.: 473,481

[22] Filed: Mar. 9, 1983

[51] Int. Cl.$^4$ .................... H01L 23/48; H01L 21/88; H01L 29/46

[52] U.S. Cl. .................... 29/577 C; 29/571; 29/589; 29/578; 29/576 R; 148/1.5; 148/174; 357/41; 357/51; 357/59; 357/71

[58] Field of Search .................. 29/571, 576 R, 576 B, 29/577 R, 577 C, 578, 610 R, 589; 148/1.5, 174, 186, 187, 189; 357/41, 47, 51, 59, 67, 71

[56] References Cited

U.S. PATENT DOCUMENTS

| | | | |
|---|---|---|---|
| 3,975,221 | 8/1976 | Rodgers | 29/571 X |
| 4,214,917 | 7/1980 | Clark et al. | 29/571 X |
| 4,329,706 | 5/1982 | Crowder et al. | 29/571 X |
| 4,356,622 | 11/1982 | Widmann | 357/675 X |
| 4,364,166 | 12/1982 | Crowder et al. | 29/589 X |
| 4,389,257 | 6/1983 | Geipel et al. | 29/571 X |
| 4,392,150 | 7/1983 | Courreges | 357/675 X |
| 4,403,394 | 9/1983 | Shepard et al. | 29/571 |
| 4,419,812 | 12/1983 | Topich | 29/571 |
| 4,443,930 | 4/1984 | Hwang et al. | 357/675 X |

Primary Examiner—Brian E. Hearn
Assistant Examiner—David A. Hey
Attorney, Agent, or Firm—Patrick T. King; Eugene H. Valet; Gary T. Aka

[57] ABSTRACT

A fabrication method and resulting integrated circuit structure that provide a second level of interconnect, a low resistance contact strap between underlying layers which is not sensitive to alignment and low lateral diffusion polysilicon load. The method comprises the steps of providing contact openings in an insulating layer on a wafer to any desired underlying circuit layers, depositing a silicide layer on the wafer, removing selected portions of the silicide layer, depositing a polysilicon layer on the wafer, lightly doping the polysilicon layer to a level appropriate for the resistor, and then removing portions of the polysilicon along with underlying silicide.

3 Claims, 14 Drawing Figures

METHOD OF FORMING A LOW RESISTANCE QUASI-BURIED CONTACT

FIELD OF THE INVENTION

The present invention relates generally to integrated circuit technology, and more specifically to a low resistance interconnect system having particular applicability to RAM cell fabrication.

BACKGROUND OF THE INVENTION

As integrated circuit structures have become increasingly complex, it has become necessary to provide multiple levels of interconnection. While the use of a metallic interconnection layer is preferred from the point of view of high conductivity, metallic layers are incapable of withstanding the high temperatures that characterize some of the process steps. Accordingly, it has become standard practice to use refractory materials such as metal silicides for interconnection where subsequent high temperature steps are to be carried out.

One of the major characteristics of the progress in intergrated circuit technology has been a dramatic decrease in the size of the circuit elements on the wafer. However, making the elements smaller is not a matter of merely scaling the dimensions. As the transverse dimensions (the dimensions in the plane of the wafer) are decreased, the ultimate circuit performance becomes increasingly sensitive to minor mask misalignment during processing. At the same time, the increases in circuit complexity and the number of interconnection layers have required a greater number of masking steps, thereby compounding the problem.

For example, in the prior art, a quasi-buried contact ("QBC") between a polycrystalline silicon ("polysilicon") layer and an underlying doped region in the silicon substrate has required that the two materials interface over a certain minimum area if low resistance contact is to be achieved. This stringent requirement of positive overlap renders the circuit structure highly sensitive to possible mask misalignment.

A typical application of a quasi-buried contact is to connect a polysilicon load resistor to the drain of an FET in a memory cell. In the prior art, the load resistor is typically made by providing a polysilicon layer having spaced interconnection regions and an intermediate resistor region, lightly doping the resistor region of the layer, and heavily doping the spaced interconnection regions of the layer. However, when the wafer is subjected to subsequent high temperature process steps, dopant from the interconnection regions diffuses laterally into the lightly doped polysilicon, thereby reducing the effective resistor length in a manner that may be difficult to control. This lateral diffusion further places a lower limit on the resistor dimensions. Moreover, depending on the particular process chosen, the resistor parameters (depending as they do on the transverse extent of the lightly doped portion of polysilicon layer) may be sensitive to possible mask misalignment.

Accordingly, there are ever-present in the art a need either to reduce the number of masking steps, or to provide additional functions or benefits without increasing the number of masking steps, and a need to reduce critical dependency on mask alignment.

SUMMARY OF THE INVENTION

The present invention provides a method and resulting structure that may be incorporated into any standard MOS process to provide a second level of interconnect and low lateral diffusion polysilicon load. The invention requires minimal additional masking steps, and relieves critical mask alignment requirements.

The above-mentioned benefits are achieved by the use of a silicide/polysilicon ("inverted polycide") sandwich. The process comprises the steps of providing contact openings in an insulating layer to any desired underlying circuit layers, depositing a silicide layer over the wafer, removing selected portions of the silicide layer, depositing a polysilicon layer over the wafer, lightly doping the polysilicon layer to a level appropriate for the resistor, and then removing portions of the polysilicon along with underlying silicide. This latter removing (masking and etching) step is carried out so as to leave (a) a region of polysilicon without underlying silicide to define the resistor, (b) at least one region of inverted polycide sandwich contiguous with the resistor to define a resistor contact, and (c) typically at least one other region of the inverted polycide sandwich to provide an additional interconnection. A buffer layer of polysilicon may be deposited immediately prior to depositing the silicide layer.

The inverted polycide sandwich serves as a low resistance interconnect layer that can be used to provide a wide variety of contacts, including a DC voltage line for a memory cell array. The inverted polycide sandwich can also be used as a low resistance strap overlying a quasi-buried contact region. The integrity of the quasi-buried contact does not depend on dopant diffusion to provide the low resistance, and is not critically dependent on positive overlap of the two layers to be connected.

By using the inverted polycide sandwich to strap a DC voltage to one side of the resistor, dopant diffusion from that side is eliminated. Thus, a desired effective resistor length may be achieved with a smaller actual resistor length, thereby allowing greater circuit density. Additionally, since the other side of the polysilicon load resistor is coupled to other circuit elements by the inverted polycide sandwich, the silicide layer acts as a barrier to reduce the degree of dopant diffusion. It should be noted that these benefits are achieved without requiring extra masking steps, since the silicide removal mask of the present invention compares to the resistor implant mask of the prior art.

For a further understanding of the nature and advantages of the present invention, reference should be made to the remaining portions of the specification and to the attached drawings.

DESCRIPTION OF THE PREFERRED EMBODIMENTS

Figure 1:
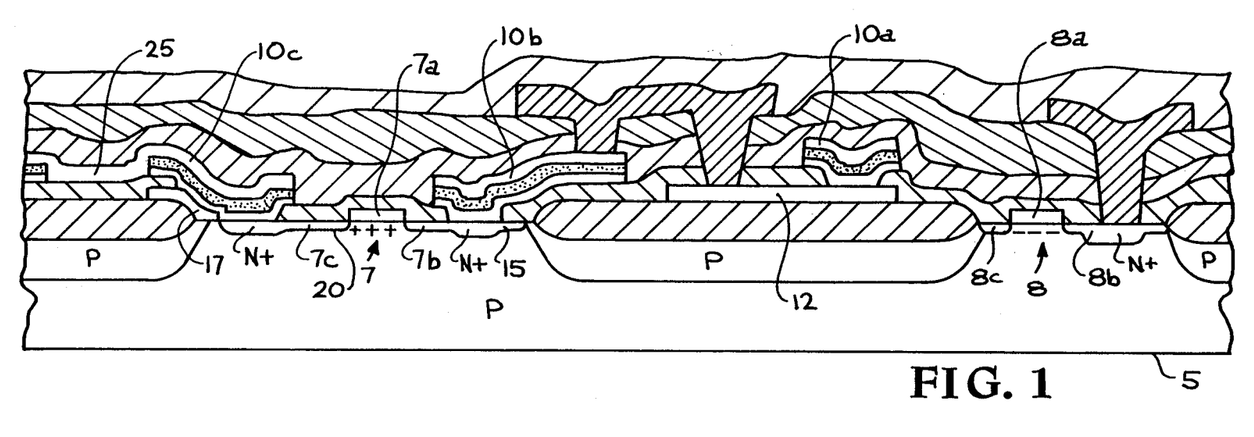
FIG. 1 is a sectional view of a portion of an integrated circuit structure showing the inverted polycide sandwich of the present invention.

FIG. 1 is a cross-sectional view of a portion of an integrated circuit structure utilizing the present invention. For purposes of illustration, the invention will be described as incorporated into a standard NMOS process, and more particularly in the context of a process for making a static random access memory ("RAM").

Broadly, the present invention contemplates depositing a layer of silicide material such as tantalum silicide or molybdenum silicide, followed by depositing a layer of polycrystalline silicon ("polysilicon"). The silicide/-polysilicon sandwich (hereinafter sometimes "inverted polycide" sandwich) is applied over selected regions of the integrated circuit structure to provide a low resistance interconnect structure.

A substrate wafer 5 has formed thereon an enhancement mode field effect transistor ("FET") 7 and a depletion mode FET 8. FET 7 has a gate 7a, a source 7b, and a drain 7c; FET 8 has a gate 8a, a source 8b, and a drain 8c. Segments 10a, 10b, and 10c of the inverted polycide sandwich are shown making connection to various portions of the circuit. Segment 10a makes connection to a polysilicon layer 12 which may, for example, be a word line in a static RAM cell. Segment 10b of the inverted polycide sandwich makes connection to a portion 15 of the N+ layer contiguous with source 7b. Portion 15 may, for example, be a voltage supply ($V_{ss}$) line with segment 10b providing a low resistance strap. Segment 10c of the inverted polycide sandwich provides a low resistance quasi-buried contact ("QBC") of a polysilicon layer 17 to a portion 20 of the N+ layer contiguous with drain 7c. Furthermore, as will be described below, selected portions of the silicide layer are removed prior to depositing the polysilicon layer to define a polysilicon load resistor 25.

FIGS. 2A-H are cross-sectional views illustrating the sequence of processing steps that are performed in order to fabricate the integrated structure shown in FIG. 1. Representative geometrical and material parameters such as dopant concentration, implantation depth, layer thickness, and electrical resistance are tabulated in Appendices 1-3 below.

Figure 2A:
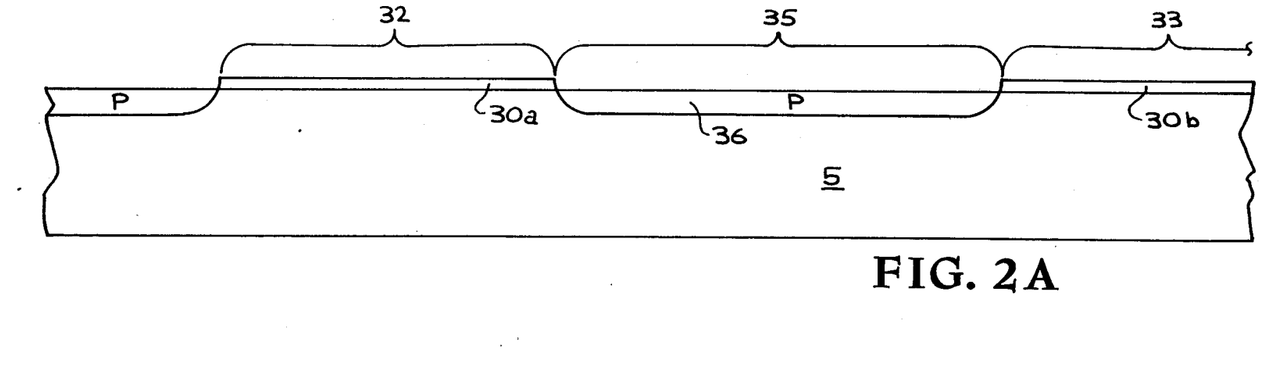
FIGS. 2A–H are sectional views illustrating the process steps performed to arrive at the structure of FIG. 1.

FIG. 2A shows wafer 5 after it has been subjected to the following steps:
- preoxidation,
- barrier oxidation,
- source/drain mask, and
- field doping.

More particularly, a thin barrier oxide layer is deposited by heating the wafer in an oxygen atmosphere, and a silicon nitride layer is then deposited by standard techniques. The source/drain regions are masked by selectively removing portions of the nitride layer and underlying oxide layer leaving nitride/oxide layer segments 30a and 30b over respective regions 32 and 33 to define the source/drain mask. The region 35 that is not masked is then subjected to the ion implantation of a P-type impurity to define a channel stop region 36.

Figure 2B:
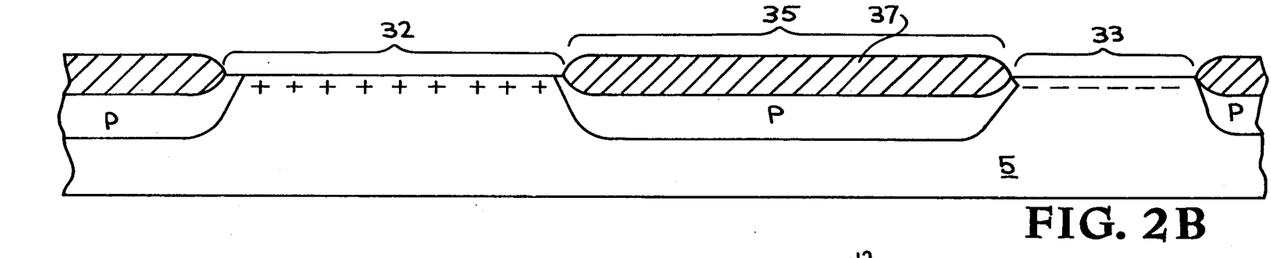

FIG. 2B shows wafer 5 after it has been subjected to the following additional steps:
- field oxidation,
- implant oxidation 1,
- enhancement mask and doping,
- depletion mask and doping, and
- gate oxidation.

More particularly, a field oxide layer 37 is formed from region 35 by heating the wafer in an atmosphere of steam. The nitride/oxide mask that defines region 35 is then removed by a plasma etch and Kooi ribbon oxidation. Prior to doping regions 32 and 33, a very thin oxide layer (not shown) is grown to randomize the ion implantation. In a series of mask layer deposition and definition steps, region 32 then has P-type impurities implanted while region 33 has N-type impurities implanted. Portions of the implanted layers within regions 32 and 33 will ultimately define the channels for FETs 7 and 8. After these enhancement and depletion region definition and implantation steps, a gate oxide layer is grown over regions 32 and 33 by heating the wafer in an atmosphere of oxygen and hydrogen chloride. This gate oxide layer, being very thin, is not illustrated.

Figure 2C:
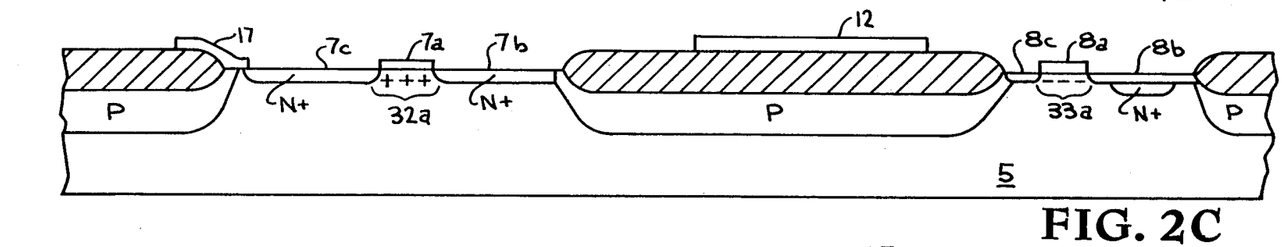

FIG. 2C shows wafer 5 after it has been subjected to the following additional steps:
- polysilicon (gate) deposition and doping,
- polysilicon (gate) definition,
- implant oxidation 2, and
- source/drain doping and annealing.

More particularly, a polysilicon layer is deposited by a chemical vapor deposition ("CVD") process, and phosphorus added by deposition and diffusion by heating in an atmosphere of phosphorus oxychloride. Selected portions are then removed to leave segments 12 and 17 and polysilicon gates 7a and 8a. The portions of regions 32 and 33 not occupied by gates 7a and 8a are then subjected to the implantation of N-type impurities such as arsenic to define the source and drain of each of FETs 7 and 8.

Figure 2D:
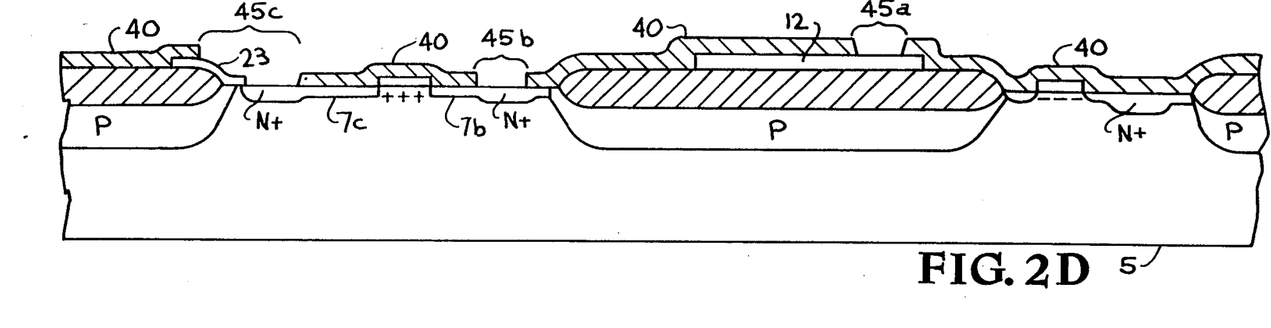

FIG. 2D shows wafer 5 after it has been subjected to the following additional steps:
- CVD oxide deposition and densification 1, and
- QBC mask.

More particularly, a layer 40 of silicon dioxide is deposited by a CVD process, densified to remove pinholes, and has portions removed over regions 45a, 45b, and 45c to define contact regions for the present invention. These regions are defined by an etching step which removes the CVD oxide (as well as the thin layer of oxide over N+ layer portions 15 and 20). The opening over region 45a exposes a portion of polysilicon segment 12; the opening over region 45b exposes N+ layer portion 15 that is contiguous with source 7b; and the opening over region 45c exposes a portion of polysilicon layer segment 17 and N+ layer portion 20 in the substrate to define a QBC region.

Figure 2E:
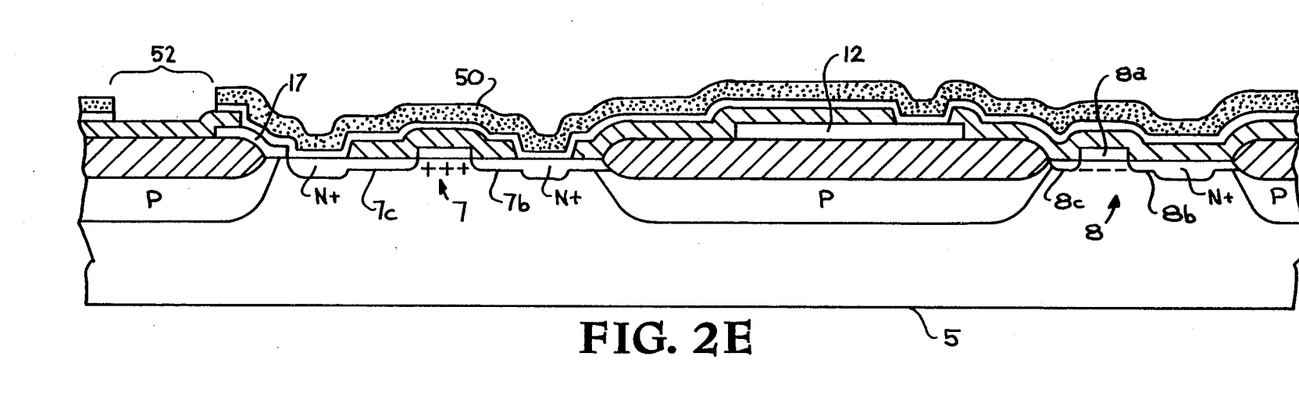

FIG. 2E shows wafer 5 after it has been subjected to the following additional steps:
- buffer polysilicon deposition and doping,
- silicide deposition, and
- silicide mask.

More particularly, a relatively thin (about 1000 Å) buffer layer of polysilicon 48 is deposited by a CVD process and doped by phosphorus oxychloride. A layer 50 of molybdenum silicide (about 2000 Å) is then deposited. This may be carried out by sputtering the silicide material, either with separate silicon and molybdenum targets or with a composite target. A selected portion of silicide layer 50 (and underlying buffer layer 48) is then removed over a region 52 to expose the underlying portion of CVD oxide layer 40. The buffer layer has the advantages of tending to relieve stress when the inverted polycide sandwich makes contact to the N+ layer, and further tending to reduce contact resistance. However, buffer layer 48, being relatively heavily doped polysilicon, has the disadvantage of contributing to some lateral dopant diffusion into the resistor (described below). Accordingly, depending on the particular circumstances, it may be desirable to eliminate buffer layer 48 if the stress can be relieved otherwise.

Figure 2F:
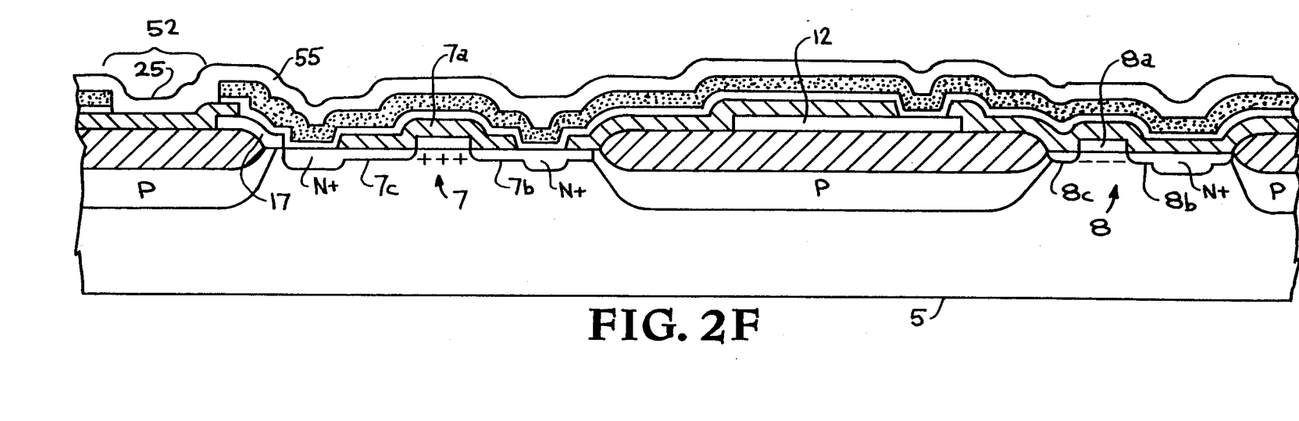

FIG. 2F shows wafer 5 after it has been subjected to the deposition and doping of a second polysilicon layer (third polysilicon layer if buffer layer 48 is provided). More particularly, a layer 55 of polysilicon (about 2000 Å) is deposited over the entire wafer, whereupon layers 50 and 55 define the inverted polycide sandwich of the present invention. Polysilicon layer 55 is then subjected to an implantation step to dope it to the desired conductivity to define resistor 25. While it is only necessary to dope the portion of polysilicon layer 55 over region 52 (the resistor), an extra masking step is avoided by doping the whole layer.

Figure 2G:
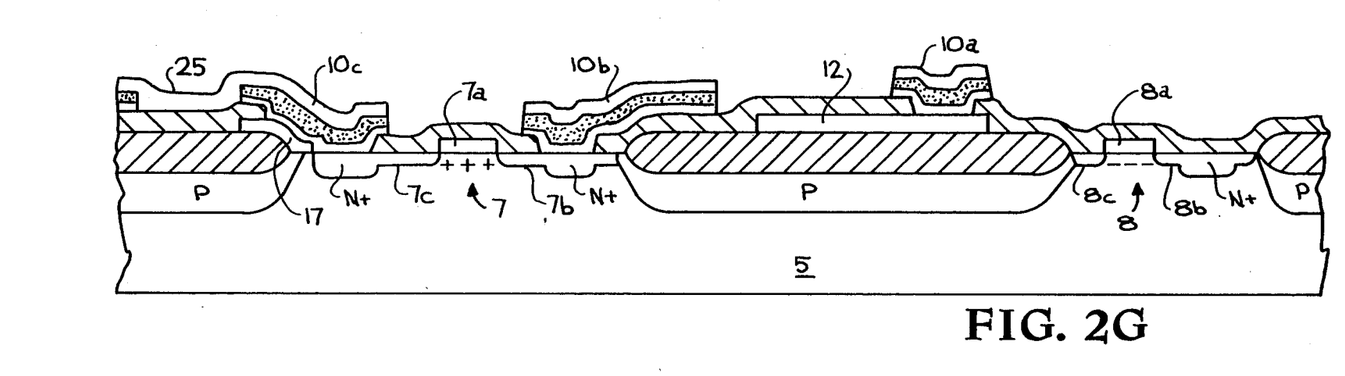

FIG. 2G shows wafer 5 after it has been subjected to a masking and etching step in which selected portions of the inverted polycide sandwich (layers 48, 50 and 55) are removed, leaving segments 10a, 10b, and 10c as well as resistor 25. The etching step may be advantageously carried out in a plasma etching process using sulphur hexafluoride as the etchant gas.

Figure 2H:
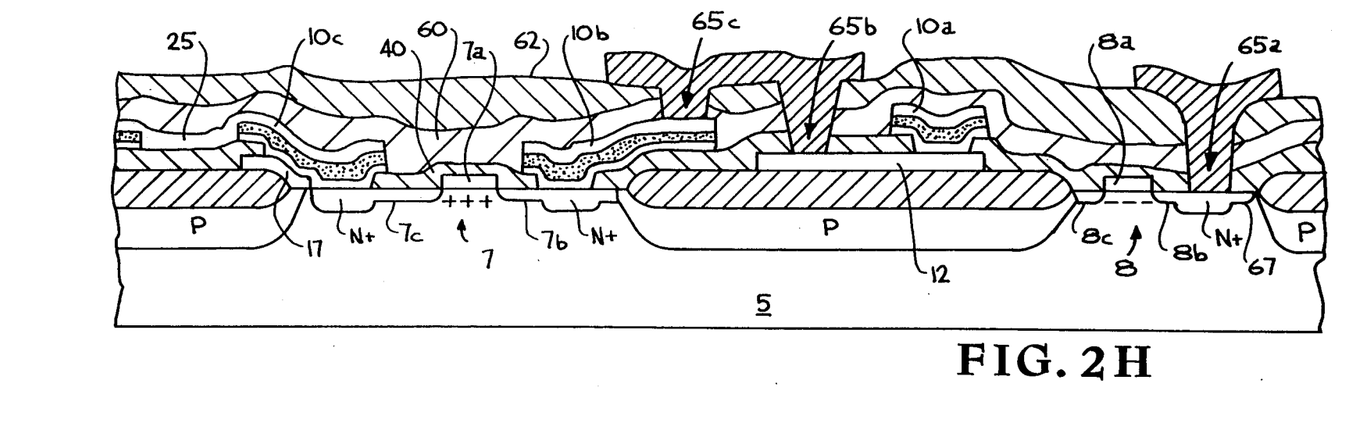

FIG. 2H shows wafer 5 after it has been subjected to the following additional steps:
  CVD oxide deposition and densification 2,
  PVX deposition and densification,
  backside polysilicon removal,
  contact mask and reflow,
  silicon/aluminum deposition,
  metal mask, and
  alloy.

More particularly, a second layer 60 of CVD oxide is deposited as described above and a layer 62 of oxide heavily doped with phosphorus is applied. Selected portions of layers 60 and 62, as well as layer 40 where applicable, are then removed to define contact openings 65a, 65b, and 65c. The contact openings are then doped with phosphorus oxychloride to lower the contact resistance and smooth out the contact profile. A silicon/aluminum layer is then deposited, and selected portions removed, thereby providing metallic contact to a substrate region 67 of N+ material contiguous with source 8b, to a portion of polysilicon layer segment 12, and to a portion of inverted polycide sandwich segment 10b.

Following the definition of the selected regions of metallization, the wafer is subjected to the following additional steps:
  fuse repair/pre-topside electrical test,
  topside deposition,
  topside mask, and
  electrical test.

These steps are standard and result in the structure is that shown in FIG. 1.

The previous description illustrates the various types of low resistance connections that can be made by and to the inverted polycide sandwich of the present invention. As discussed above, this includes connection to the N+ layer, the first polysilicon layer, or the metal layer. Additionally, the present invention provides a contact strap for a low resistance polysilicon to N+ quasi-buried contact.

To illustrate further the benefits provided by the present invention, including flexibility in circuit design layout, an example of a particular static RAM cell will be described. While there is a close relationship between the exemplary RAM cell and the circuit structure of FIG. 1, the correspondence is not precise. Indeed, the RAM cell does not incorporate all types of interconnection shown in FIG. 1.

Figure 3:
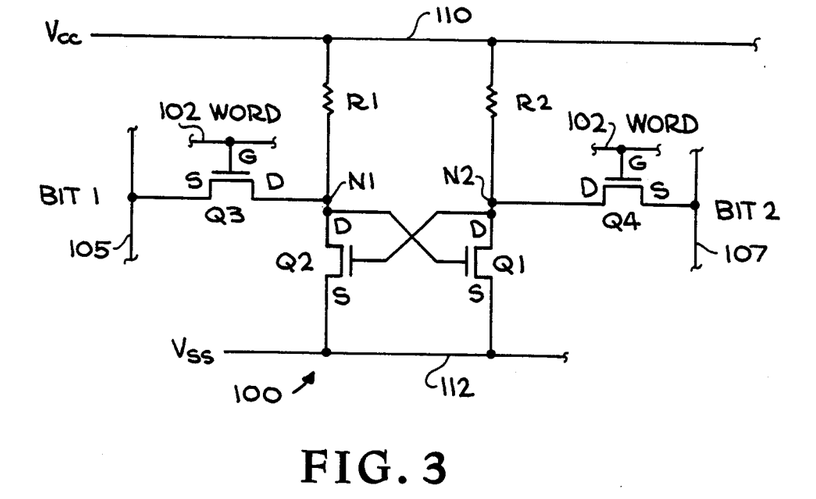
FIG. 3 is a circuit schematic of a RAM cell which may be constructed according to the present invention.

FIG. 3 is a circuit schematic of a RAM cell 100 which may be constructed incorporating the present invention. RAM cell 100 includes four enhancement mode transistors, designated Q1, Q2, Q3, and Q4. Transistors Q1 and Q2 are in a standard cross-coupled or flip-flop arrangement. Transistors Q3 and Q4 are pass transistors having their gates coupled to a word line 102 and their sources coupled to respective bit lines 105 and 107. Voltage levels are supplied to RAM cell 100 via a $V_{cc}$ line 110 and a $V_{ss}$ line 112. The gate of transistor Q1, the drain of transistor Q2, and the drain of transistor Q3 are coupled to a node, designated N1; the gate of transistor Q2, the drain of transistor Q1, and the drain of transistor Q4 are coupled to a node designated N2. First and second load resistors, designated R1 and R2, have respective first ends coupled to nodes N1 and N2 and respective second ends coupled to $V_{cc}$ line 110. The operation of RAM cell 100 is well known by those having ordinary skill in the art, and will not be described further.

FIGS. 4A–D are plan views illustrating a preferred layout for fabricating RAM cell 100 according to the process outlined above with reference to FIGS. 2A–H. In each of FIGS. 4A–D, all transverse layer boundaries are depicted as solid lines, with cross-hatching used to show the particular layer being discussed.

Figure 4A:
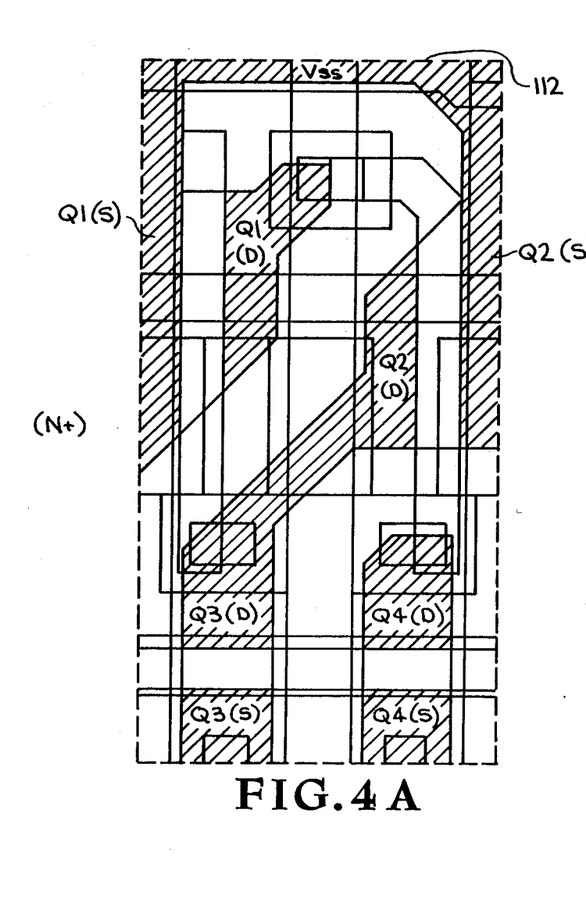
FIGS. 4A–D are plan views showing the transverse extent of the various layers in the RAM cell structure.

FIG. 4A shows the extent of the N+ layer. That is, the cross-hatched region in FIG. 4A corresponds to the portion of the cell that is subjected to the source/drain ion implantation. The hatched N+ region defines the source and the drain regions of the four transistors as well as $V_{ss}$ line 112.

Figure 4B:
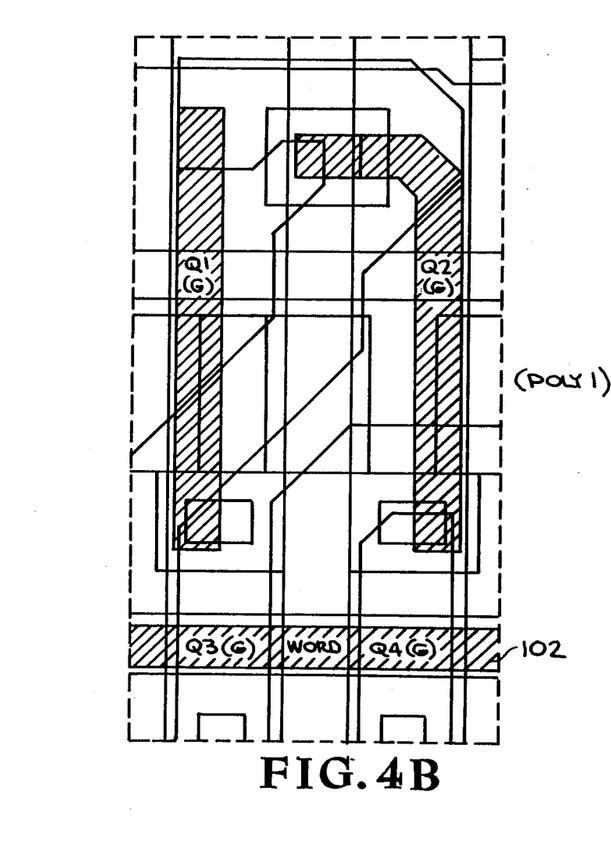

FIG. 4B shows the extent of the first polysilicon layer (corresponding generally to portions 7a, 8a, 12, and 17 shown in FIG. 2C). The hatched polysilicon layer defines the gates of the four transistors as well as word line 102.

Figure 4C:
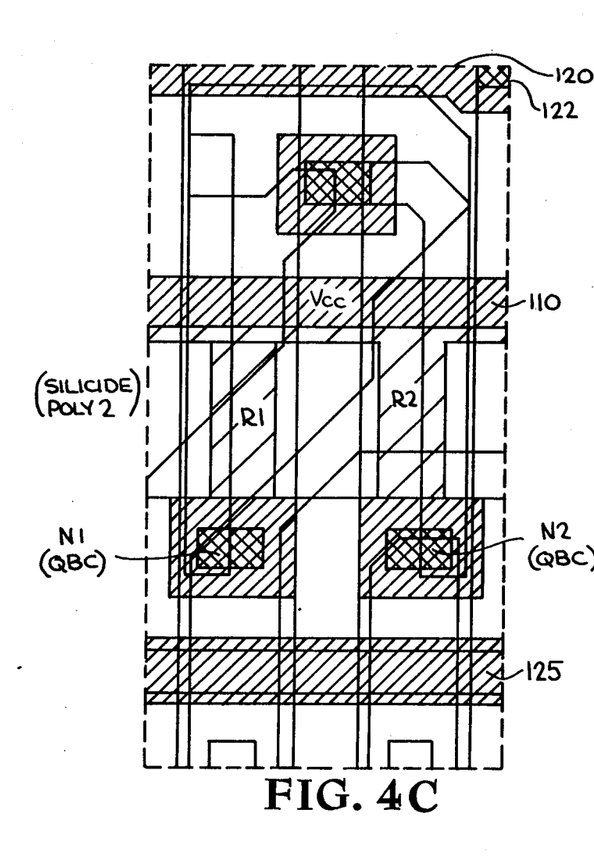

FIG. 4C shows the region occupied by the layers corresponding to silicide layer 50 and polysilicon layer 55, the deposition and definition of which are illustrated in FIGS. 2E–G. As shown in FIG. 2D, prior to the deposition of polysilicon buffer layer 48 and silicide layer 50, CVD oxide layer 40 is deposited, and openings 45a–c made. The region occupied by these openings is depicted in FIG. 4C by criss-cross hatching. As shown in FIG. 2E, a region of silicide layer 50 (and corresponding region of underlying buffer layer, if any) is removed prior to the deposition of polysilicon layer 55 in order to define the load resistors. This region, which defines the extent of resistors R1 and R2, is depicted in FIG. 4C by hatching that has a wider spacing than the remaining portions. These remaining portions (as well as the criss-cross hatched portions) show the extent of the inverted polycide sandwich.

As well as providing $V_{cc}$ line 110 and the contact strap for QBC contacts at nodes N1 and N2, the inverted polycide sandwich provides a low resistance strap for N+ $V_{ss}$ line 112. More particularly, a strip 120 of the inverted polycide sandwich is connected to the underlying N+ line at a small region 122 within each cell (corresponding to contact opening 45b in FIG. 2D). Additionally, a strip 125 of the inverted polycide sandwich overlies the polysilicon gate/word line region of FIG. 4B, and makes connection thereto at a small region of every eighth cell (not shown).

Figure 4D:
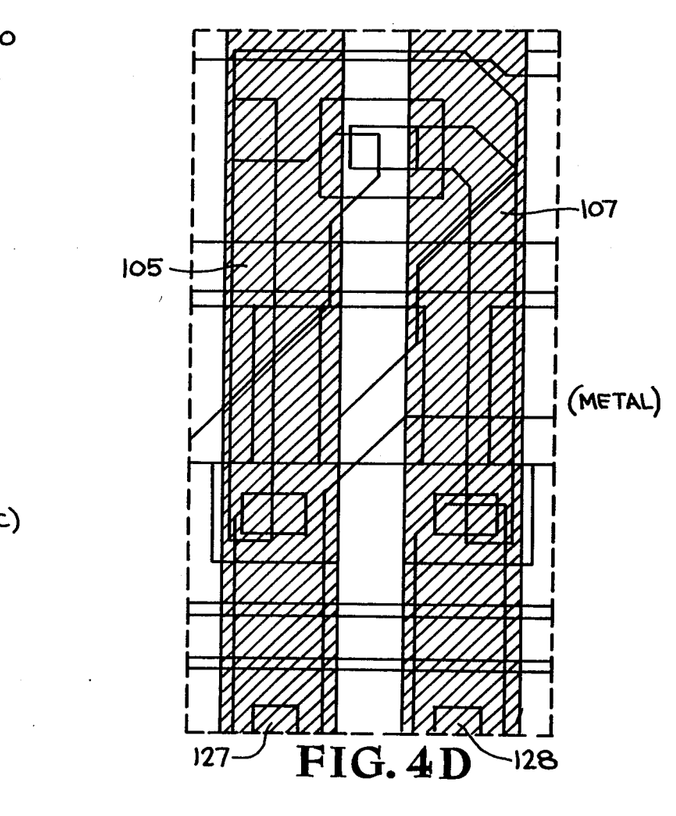

FIG. 4D illustrates the striplike regions that are metallized to define bit lines 105 and 107. The metallic bit lines make contact with the N+ layer (the sources of transistors Q3 and Q4) at contact openings 127 and 128.

In summary, it can be seen that the present invention provides a number of benefits in the design and fabrication of integrated circuit structures. As shown in FIG. 1, the inverted polycide sandwich provides a low resistance interconnect layer that may be connected to the N+ layer, the first polysilicon layer, or the metal layer with low resistance contact. The first two of these contact types are used in the particular RAM cell illustrated in FIGS. 4A-B. With respect to the contact to polysilicon and N+ substrate regions, the inverted polycide sandwich provides a quasi-buried contact which does not depend on dopant diffusion from the polysilicon to dope the QBC strap for the low resistance. Thus, there is no restriction on the overlap distance between the first polysilicon layer, (for example, layer 17) and the N+ layer (for example, portion 20). Thus, the integrity of the contact is not compromised should minor mask misalignment occur.

The order of depositing the silicide and polysilicon layers, and the structure resulting therefrom, allows a simple way to provide polysilicon load resistors. By the expedient of simply removing a portion of the silicide layer prior to depositing the polysilicon layer, the load resistor may be defined. This required only one additional masking level, since portions of the silicide and polysilicon layers are removed in the same etching step. Since the load resistor is defined by a single mask, the length may be made insensitive to mask misalignment.

The definition of the polysilicon load resistor in the manner described above has the advantage that because it is the inverted polycide sandwich that connects to the load resistor, there is less lateral dopant diffusion. More particularly, while dopant diffusion from heavily doped first polysilicon layer at the QBC contact does occur, it is partly blocked by the silicide layer. There is no dopant diffusion at the other side. As noted above, the embodiment that includes doped buffer layer 48 is subject to lateral diffusion from the buffer layer.

It will also be appreciated that the inverted polycide sandwich tends to have a smoother contour than if the polysilicon layer were deposited first, since the silicide material typically etches more slowly than the polysilicon.

While the polysilicon layer in the sandwich, due to its relatively high resistance, generally serves no electrical purpose in the regions other than where it defines the load resistor, it serves as a thermal conductor, thereby reducing temperature-induced degradation (increased resistance, electron migration) of the silicide layer. Furthermore its serves as an electrical shunt in case there is a microscopic crack in the silicide layer. Additionally, it facilitates contact to the silicide and underlying material since it bonds well to most materials.

While the above provides a full and complete description of the preferred embodiments of the present invention, various modifications, alternate constructions and equivalents may be employed without departing from the true spirit and scope of the invention. For example, while the above description includes the deposition of a polysilicon buffer layer prior to the deposition of the silicide layer, the present invention does not require this underlying polysilicon layer. Additionally, while the present invention is described in the context of a static RAM cell, it will be appreciated that other circuit configurations can equally well benefit from the present invention. Moreover, while specific materials and parameters are disclosed in describing the preferred embodiment, such disclosures are illustrative only, and other materials and parameters may be used. Therefore, the above description and illustrations should not be construed as limiting the scope of the invention which is defined by the appended claims.

Appendix 1 - Implantation Parameters

| Region | Depth | Dopant (molecules/cm$^3$) |
| --- | --- | --- |
| channel stop 36 | 1 micron | $10^{16}$–$10^{17}$ B |
| enhancement 32 | 1 micron | $10^{16}$ B |
| depletion 33 | 0.3–0.6 micron | $10^{16}$–$10^{17}$ As |
| source/drain | 0.3–0.4 micron | $10^{20}$ As |

Appendix 2 - Layer Parameters

| Layer | Thickness | Dopant (molecules/cm$^3$) |
| --- | --- | --- |
| barrier oxide 27 | 200–700 A | |
| nitride 30 | 500–1000 A | |
| field oxide 37 | 0.7–1 micron | |
| implant oxide | 100 A | |
| gate oxide | 300 A | |
| polysilicon gate 7a, 8a | 0.2–0.5 micron | $10^{20}$–$10^{21}$ P |
| CVD oxide 40 | 0.2–0.5 micron | |
| polysilicon buffer 48 | 0.1–0.2 micron | $10^{20}$–$10^{21}$ P |
| silicide 50 | 0.1–0.3 micron | |
| polysilicon 55 | 0.1–0.3 micron | $10^{19}$ As |
| CVD oxide 60 | 0.2–0.5 micron | |
| PVX oxide | 1 micron | 4–8% P |

Appendix 3 - Electrical Characteristics

| Layer/Region | Resistivity ($\Omega$/square) |
| --- | --- |
| source drain | 40 |
| polysilicon gates | 30 |
| silicide 50 | 5 |
| polysilicon 55 | $10^9$ |

I claim:

1. In the fabrication of an integrated circuit structure on a semiconductor substrate, a method of forming a low resistance quasi-buried contact between a first polycrystalline layer and a heavily doped region of said substrate, comprising the steps of:

depositing a silicide layer over a contiguious region between said first polycrystalline layer and said substrate region and extending there beyond to overlap said first polycrystalline layer and said substrate region; and depositing a polycrystalline silicon layer over said silicide layer;

whereupon a low resistance interconnection is provided between said first polycrystalline layer and said substrate region, regardless of the overlap distance between said first polycrystalline layer and said substrate region.

2. The invention of claim 1, and further comprising the step of doping said polycrystalline layer to determine the conductivity of said resistor portions.

3. The invention of claim 1, and further comprising the step, carried out prior to said step of depositing a silicide layer, of depositing a polycrystalline buffer layer.

* * * * *